(12) United States Patent
Mochizuki et al.

(10) Patent No.: US 10,453,824 B1
(45) Date of Patent: Oct. 22, 2019

(54) STRUCTURE AND METHOD TO FORM NANOSHEET DEVICES WITH BOTTOM ISOLATION

(71) Applicant: International Business Machines Corporation, Armonk, NY (US)

(72) Inventors: Shogo Mochizuki, Clifton Park, NY (US); Chun Wing Yeung, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/973,992

(22) Filed: May 8, 2018

(51) Int. Cl.
*H01L 25/07* (2006.01)
*H01L 21/02* (2006.01)
*H01L 29/10* (2006.01)
*H01L 29/06* (2006.01)
*H01L 21/762* (2006.01)
*H01L 21/3213* (2006.01)
*H01L 29/66* (2006.01)

(52) U.S. Cl.
CPC ...... *H01L 25/071* (2013.01); *H01L 21/02293* (2013.01); *H01L 21/02381* (2013.01); *H01L 21/02603* (2013.01); *H01L 21/32139* (2013.01); *H01L 21/762* (2013.01); *H01L 29/0673* (2013.01); *H01L 29/1029* (2013.01); *H01L 29/66545* (2013.01)

(58) Field of Classification Search
CPC ........... H01L 25/071; H01L 21/002293; H01L 21/02381; H01L 21/02603; H01L 21/32139; H01L 21/762; H01L 29/0673; H01L 29/1029; H01L 29/66545
See application file for complete search history.

(56) References Cited

U.S. PATENT DOCUMENTS

| | | | |
|---|---|---|---|
| 8,263,462 B2 | 9/2012 | Hung et al. | |
| 8,470,684 B2 | 6/2013 | Pei et al. | |
| 9,123,790 B2 | 9/2015 | Pillarisetty et al. | |
| 9,324,812 B2 | 4/2016 | Yang et al. | |
| 9,608,059 B2 | 3/2017 | Cappellani et al. | |
| 9,620,590 B1 | 4/2017 | Bergendahl et al. | |
| 9,685,545 B2* | 6/2017 | Tipirneni | H01L 29/66462 |
| 9,755,017 B1 | 9/2017 | Guillorn et al. | |
| 9,761,722 B1* | 9/2017 | Jagannathan | H01L 29/785 |
| 9,947,804 B1* | 4/2018 | Frougier | H01L 29/78696 |

(Continued)

*Primary Examiner* — Matthew L Reames
(74) *Attorney, Agent, or Firm* — Vazken Alexanian; Ryan, Mason & Lewis, LLP (57) ABSTRACT

A method for manufacturing a semiconductor device includes forming a plurality of silicon germanium and silicon layers on a semiconductor substrate in a stacked configuration comprising a repeating arrangement of a silicon layer stacked on a silicon germanium layer. The stacked configuration is patterned into a plurality of patterned stacks spaced apart from each other. The patterning forms a plurality of recessed portions in the substrate. In the method, the silicon germanium layers are etched to remove portions of the silicon germanium layers from exposed lateral sides of the silicon germanium layers, and inner spacer layers are formed in place of the removed portions. A plurality of lower epitaxial layers are grown in the recessed portions. A plurality of epitaxial source/drain regions are grown from the lower epitaxial layers and from exposed lateral sides of the silicon layers.

20 Claims, 5 Drawing Sheets

(56) References Cited

U.S. PATENT DOCUMENTS

2013/0316513 A1 11/2013 Basker et al.
2015/0137237 A1 5/2015 Jacob et al.
2015/0333167 A1 11/2015 Leobandung
2017/0133459 A1 5/2017 Pranatharthiharan et al.

* cited by examiner

STRUCTURE AND METHOD TO FORM NANOSHEET DEVICES WITH BOTTOM ISOLATION

BACKGROUND

Nanosheet devices can be viable device options instead of fin field-effect transistors (FinFETs). For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer superior electrostatics and higher current density per footprint area than FinFETs. Additionally, nanosheet devices are being pursued as a viable device option for the 5 nm node and beyond. Nanosheet formation relies on the selective removal of one semiconductor (e.g., SiGe) with respect to another (Si) to form the nanosheet and GAA structures.

In existing approaches, epitaxially grown doped source/drain regions in recessed portions of a semiconductor substrate can lead to source/drain punch-through through parasitic channel portions under the gates in nanosheet devices. Accordingly, there is a need for techniques and structures to improve isolation in order to prevent such source/drain shorts and reduce parasitic leakage for nanosheet structures.

SUMMARY

According to an exemplary embodiment of the present invention, a method for manufacturing a semiconductor device includes forming a plurality of silicon germanium and silicon layers on a semiconductor substrate in a stacked configuration comprising a repeating arrangement of a silicon layer stacked on a silicon germanium layer. The method also includes patterning the stacked configuration into a plurality of patterned stacks spaced apart from each other. The patterning forms a plurality of recessed portions in the semiconductor substrate. In the method, the silicon germanium layers are etched to remove portions of the silicon germanium layers from exposed lateral sides of each of the silicon germanium layers, and an inner spacer layer is formed in place of each of the removed portions of the silicon germanium layers. A plurality of lower epitaxial layers are grown in the plurality of recessed portions in a first epitaxial growth process. A plurality of epitaxial source/drain regions are grown from the plurality of lower epitaxial layers and from exposed lateral sides of the silicon layers in a second epitaxial growth process. The epitaxial source/drain regions are grown adjacent the plurality of patterned stacks.

According to an exemplary embodiment of the present invention, a semiconductor device includes a plurality of stacked structures spaced apart from each other on a substrate. The plurality of stacked structures each include a plurality of gate structures and a plurality of channel layers. The device also includes a plurality of lower epitaxial layers in recessed portions of the substrate adjacent the plurality of stacked structures. A plurality of epitaxial source/drain regions extend from the plurality of channel layers and from the plurality of lower epitaxial layers.

According to an exemplary embodiment of the present invention, a method for manufacturing a semiconductor device includes forming a plurality of first and second semiconductor layers on a semiconductor substrate in a stacked configuration comprising a repeating arrangement of a second semiconductor layer stacked on a first semiconductor layer. The method also includes patterning the stacked configuration into a plurality of patterned stacks spaced apart from each other. The patterning forms a plurality of recessed portions in the semiconductor substrate. In the method, the plurality of first semiconductor layers are etched to remove portions of the plurality of first semiconductor layers from exposed lateral sides of each of the plurality of first semiconductor layers, and an inner spacer layer is formed in place of each of the removed portions of the plurality of first semiconductor layers. A plurality of lower epitaxial layers are grown in the plurality of recessed portions in a first epitaxial growth process. The method further includes growing a plurality of epitaxial source/drain regions adjacent the plurality of patterned stacks. The plurality of epitaxial source/drain regions are grown from the plurality of lower epitaxial layers and from exposed lateral sides of the plurality of second semiconductor layers in a second epitaxial growth process.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to formation of lower epitaxial regions under source/drain regions, which provide electrical isolation to prevent source/drain shorts and parasitic leakage.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to methods and structures wherein undoped, carbon (C), or counter-doped lower epitaxial regions are formed under source/drain epitaxial regions. The lower epitaxial regions are formed in recessed portions of a semiconductor substrate between channel portions of the substrate that are located under gate structures. The undoped, carbon (C), or counter-doped lower epitaxial regions form electrically isolated regions which prevent shorts with channel portions of the substrate and reduce parasitic leakage for nanosheet structures.

Although embodiments of the present invention are discussed in connection with nanosheet stacks, the embodiments of the present invention are not necessarily limited thereto, and may similarly apply to nanowire stacks.

Figure 1:
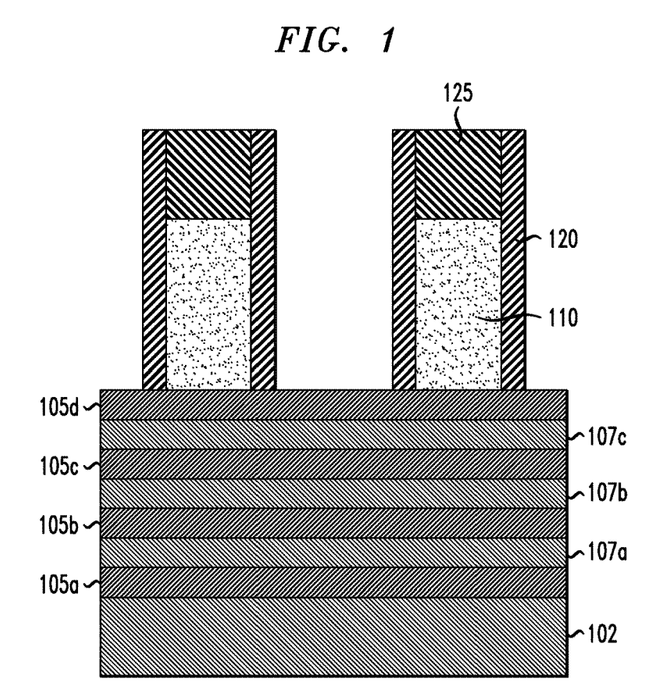
FIG. 1 is a schematic cross-sectional view illustrating manufacturing of a semiconductor device and showing formation of a stacked structure of silicon germanium (SiGe) and silicon (Si) nanosheet layers, and formation of dummy gates and spacers on a semiconductor substrate, according to an embodiment of the invention.

FIG. 1 is a schematic cross-sectional view illustrating manufacturing of a semiconductor device and showing formation of a stacked structure of silicon germanium (SiGe) and silicon (Si) nanosheet layers, and formation of dummy gates and spacers on a semiconductor substrate, according to an embodiment of the invention. As depicted in FIG. 1, a semiconductor substrate 102 comprises semiconductor material including, but not limited to, silicon (Si), silicon germanium (SiGe), III-V, II-V compound semiconductor or other like semiconductor. In addition, multiple layers of the semiconductor materials can be used as the semiconductor material of the substrate. In accordance with an embodiment of the present invention, the substrate 102 comprises a bulk silicon substrate.

Layers of silicon germanium 105a, 105b, 105c and 105d and silicon 107a, 107b and 107c are epitaxially grown in an alternating and stacked configuration on the substrate 102, so that a first SiGe layer 105a is followed by a first Si layer 107a on the first SiGe layer 105a, which is followed by a second SiGe layer 105b on the first Si layer 107a, and so on. While four SiGe layers 105a-d and three Si layers 107a-c are shown, the embodiments of the present invention are not necessarily limited to the shown number of layers 105, 107, and there may be more or less layers in the same alternating configuration depending on design constraints.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a rapid thermal chemical vapor deposition (RTCVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

As noted, in a non-limiting illustrative embodiment, SiGe layers $105a$-$105d$ of a SiGe/Si nanosheet stack are formed on the substrate 102 and intervening Si channel layers $107a$-$107c$ by epitaxial growth. Alternative materials may be used that have the property of being removed selectively compared to the nanosheet channel material, which, according to an embodiment, is silicon (e.g., layers $107a$-$107c$).

In a non-limiting illustrative embodiment, a height of the layers $105a$, $105b$, $105c$ and $105d$ can be in the range of about 6 nm-about 15 nm depending on the application of the device. Also, in a non-limiting illustrative embodiment, silicon layers $107a$-$107c$ of the SiGe/Si nanosheet stack can be formed on SiGe layers $105a$-$105c$ by epitaxial growth. In accordance with an embodiment of the present invention, the layers $107a$-$107c$ can include the same or a similar composition to the substrate 102. In a non-limiting example, a height of the layers $107a$-$107c$ can be in the range of about 6 nm-about 15 nm depending on the desired process and application. In accordance with an embodiment of the present invention, each of the layers $107a$-$107c$ has the same or substantially the same composition and size as each other, and each of the layers $105a$-$105d$ has the same or substantially the same composition and size as each other.

As depicted in FIG. 1, dummy gate material 110, including, but not necessarily limited to, polysilicon, amorphous silicon, or a dielectric material such as, for example, oxide or silicon nitride, is deposited on and around the stacked configuration of Si and SiGe using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process, such as, chemical mechanical polishing (CMP), and lithography and etching steps to remove excess dummy gate material, and pattern the deposited layers into dummy gates 110 corresponding to what is to become device gate regions.

Spacer and hardmask layers 120 and 125 are formed on top of and on sides of the dummy gates 110, which can be formed by one or more of the deposition techniques noted in connection with deposition of the dummy gate material. The spacer and hardmask material can comprise for example, one or more dielectrics, including, but not necessarily limited to, silicon oxide, silicon nitride, silicon oxynitride, boron nitride, silicon boron nitride, or multilayered stacks thereof. According to an example embodiment of the invention, the spacer layers 120 are deposited on sidewalls and the hardmask layers 125 on top surfaces of the dummy gates 110. In accordance with an embodiment of the present invention, the spacer and hardmask materials may be the same as or different from each other.

Figure 2:
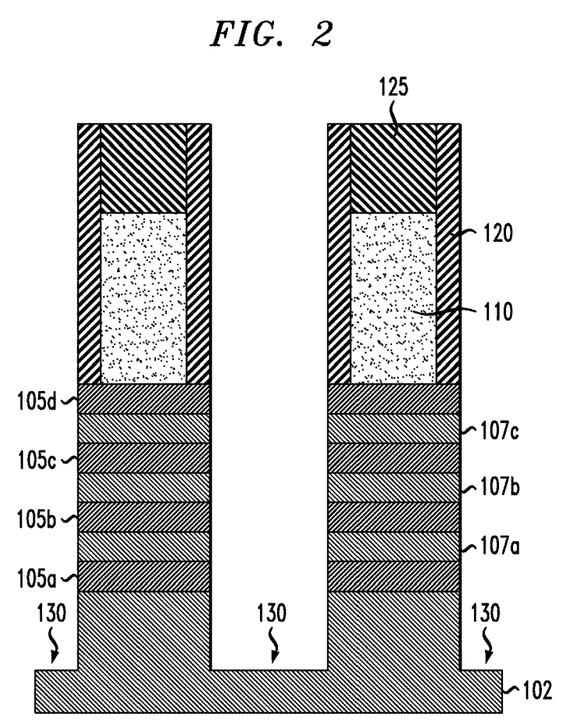
FIG. 2 is a schematic cross-sectional view illustrating manufacturing of a semiconductor device and showing patterning of the stacked nanosheet layers, according to an embodiment of the invention.

FIG. 2 is a schematic cross-sectional view illustrating manufacturing of a semiconductor device and showing patterning of the stacked nanosheet layers, according to an embodiment of the invention. Referring to FIG. 2, exposed portions of the stacked nanosheet layers, which are not under the spacer and dummy gate layers 120 and 110, are removed using, for example, an etching process, such as reactive ion etching (ME). As can be seen in FIG. 2, the portions of the stacked nanosheets or nanowires under the spacer layers 120 and under the dummy gates 110 remain after the etching process, and portions of the stacked nanosheets or nanowires in areas that correspond to source/drain regions are removed. In addition, referring to FIG. 2, portions of the substrate 102 are etched during the patterning to form recessed portions 130 in the substrate 102. In a non-limiting illustrative example, a depth of the recessed portions is about 10 nm to about 25 nm. Although shown as horizontal surfaces, in accordance with an embodiment, the bottom surfaces of the recessed portions of the substrate 102 may be formed in a concave curved shape.

Figure 3:
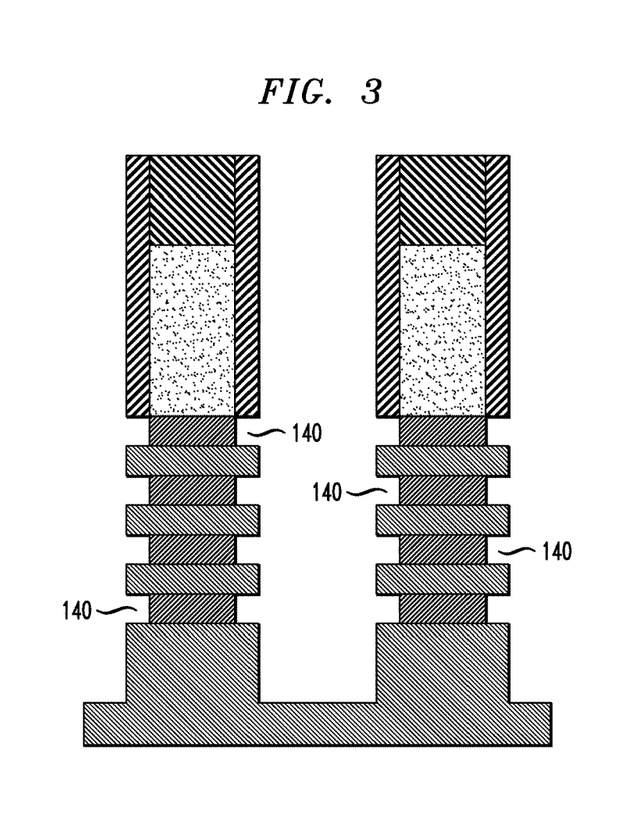
FIG. 3 is a schematic cross-sectional view illustrating manufacturing of a semiconductor device and showing lateral recessing of SiGe layers, according to an embodiment of the invention.

FIG. 3 is a schematic cross-sectional view illustrating manufacturing of a semiconductor device and showing lateral recessing of SiGe layers, according to an embodiment of the invention. As shown in FIG. 3, due to the germanium in layers $105a$-$105d$, lateral etching of the layers $105a$-$105d$ can be performed selective to layers $107a$-$107c$, such that the side portions of the SiGe layers $105a$-$105d$ can be removed to create vacant areas 140, while maintaining the side portions of layers $107a$-$107c$. Such etching can be performed using, for example, $NH_4OH:H_2O_2$ solution.

Figure 4:
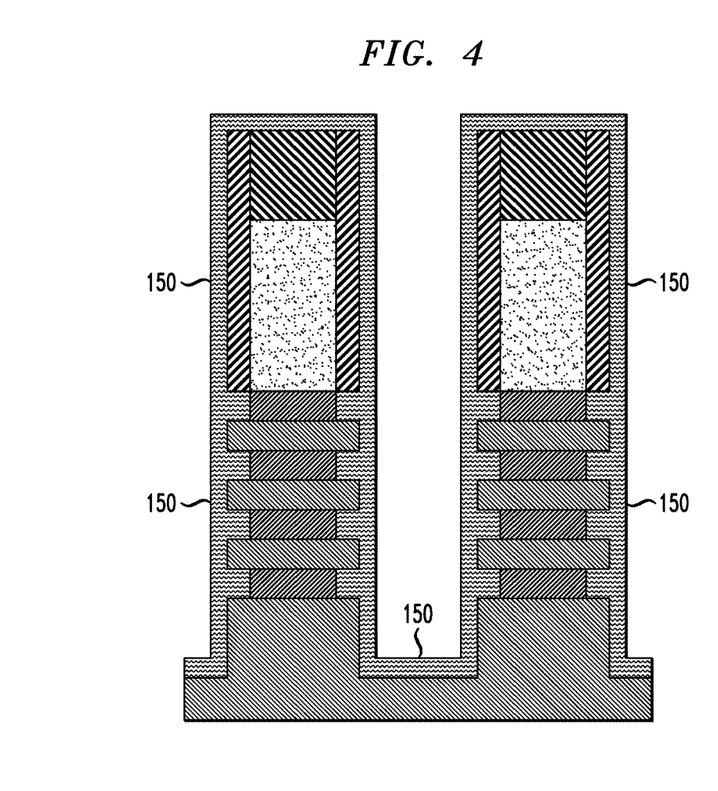
FIG. 4 is a schematic cross-sectional view illustrating manufacturing of a semiconductor device and showing formation of an inner spacer layer, according to an embodiment of the invention.

FIG. 4 is a schematic cross-sectional view illustrating manufacturing of a semiconductor device and showing formation of an inner spacer layer, according to an embodiment of the invention. As depicted in FIG. 4, an inner spacer layer 150 is deposited on top and side surfaces of the nanosheet stacks, as well on exposed surfaces of the substrate 102, including in the recessed portions 130. In accordance with an embodiment, the inner spacer layer 150 can comprise, but is not necessarily limited to, a dielectric, such as a nitride, like silicon nitride (SiN). The inner spacer layer 150 can comprise the same material as or a different material from that of the spacer layer 120.

In accordance with an embodiment of the present invention, the vacant portions 140 left by removal of the side portions of the layers 105a-105d are filled in by portions of the inner spacer layer 150 formed on side surfaces of the nanosheet stacks. Deposition of the inner spacer/liner layer 150 can be performed using a deposition technique including, but not necessarily limited to, ALD.

Figure 5:
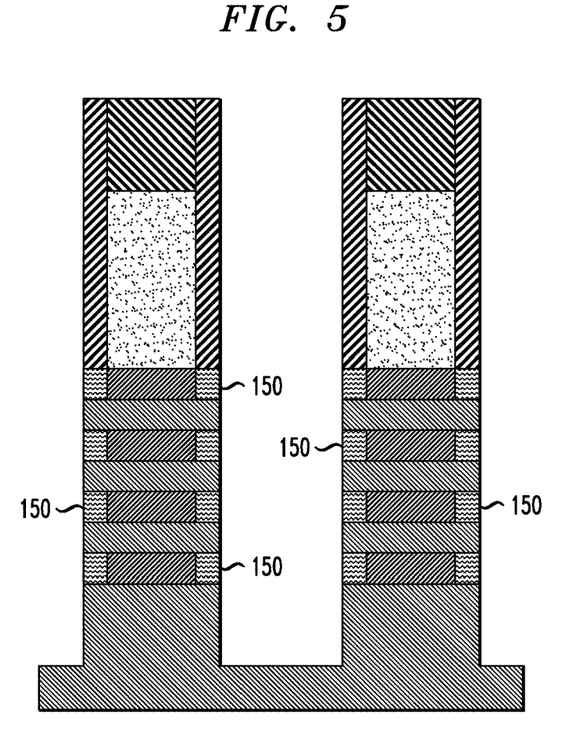
FIG. 5 is a schematic cross-sectional view illustrating manufacturing of a semiconductor device and showing removal of portions of the inner spacer layer, according to an embodiment of the invention.

FIG. 5 is a schematic cross-sectional view illustrating manufacturing of a semiconductor device and showing removal of portions of the inner spacer layer, according to an embodiment of the invention. As depicted in FIG. 5, portions of the inner spacer layer 150 are removed from horizontal surfaces, including from the top of the spacer and hardmask layers 120, 125 on the nanosheet stacks and from horizontal portions or approximately horizontal portions (in the case of concave curved portions) of the substrate 102 in the recessed portions 130. In addition, portions of the inner spacer layer 150 on sides of the nanosheet stacks and on sides of the spacer layers 120 are also removed, leaving the portions of the inner spacer 150 in the formerly vacant portions 140 as shown in FIG. 5. The portions of the substrate 102 in the recessed portions 130 are exposed by the removal of the portions of the layer 150, while keeping the sidewalls of the SiGe layers 105a-105d covered by the remaining portions of the inner spacer layer 150. In a non-limiting illustrative example, at least one embodiment of the invention includes using a removal process, such as a gas cluster ion beam (GCIB) process to perform the removal of the portions of the inner spacer layer 150.

Figure 6:
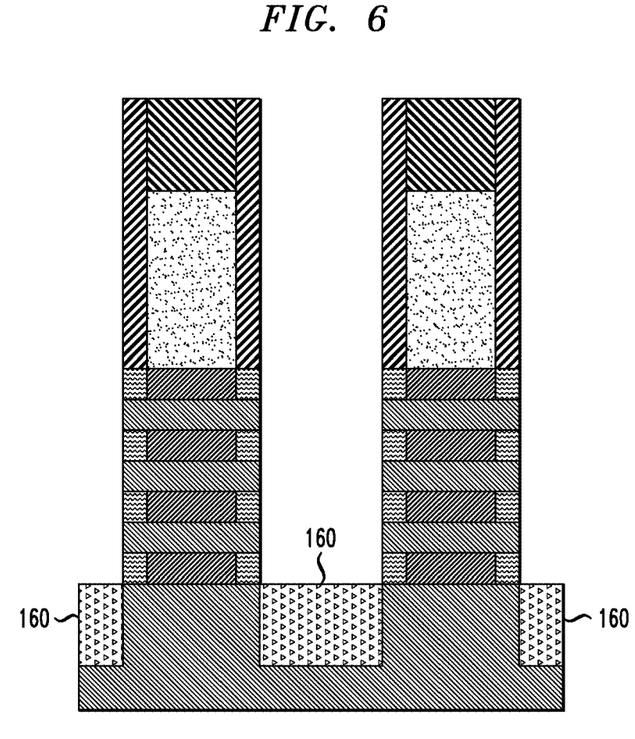
FIG. 6 is a schematic cross-sectional view illustrating manufacturing of a semiconductor device and showing growth of lower epitaxial layers, according to an embodiment of the invention.

FIG. 6 is a schematic cross-sectional view illustrating manufacturing of a semiconductor device and showing growth of lower epitaxial layers, according to an embodiment of the invention. Referring to FIG. 6, lower epitaxial layers 160 are grown in the recessed portions 130 in a bottom-up epitaxial growth process. In accordance with an embodiment of the present invention, the conditions of the epitaxial growth process, including, for example, pressure, temperature and precursor, are controlled so that there is no epitaxial growth from semiconductor sidewalls, and only bottom-up growth from bottom surfaces of the recessed portions 130 of the substrate 102. According to a non-limiting embodiment of the present invention, the conditions of the bottom-up epitaxial growth process are, for example RTCVD epitaxial growth using $SiH_4$, $GeH_4$, $CH_3SiH_3$, $B_2H_6$, $PF_3$, and/or $H_2$ gases with temperature and pressure ranges of about 450° C. to about 800° C., and about 1 Torr-about 50 Torr, respectively.

In accordance with an embodiment of the present invention, the lower epitaxial layers 160 are grown to height that is level or substantially level with upper surfaces of the substrate 102 under the lowermost SiGe layers 105a of the patterned stacks without exceeding a height of the lower surface of layers 107a. The lower epitaxial layers 160 are undoped, carbon (C) doped or counter-doped. If carbon doped, the lower epitaxial layers 160 are doped with carbon at a concentration in the range of about $1E19/cm^3$ to about $1E21/cm^3$. If counter-doped, the doping of the lower epitaxial layers 160 is the opposite of a doping of source/drain regions 165 (see FIG. 7). For example, if the source/drain regions are p-type doped, the lower epitaxial layers 160 are n-type doped, with for example, phosphorous at concentrations of about $5E18/cm^3$ to about $1E20/cm^3$, and if the source/drain regions are n-type doped, the lower epitaxial layers 160 are p-type doped, with for example, boron at concentrations of about $5E18/cm^3$ to about $1E20/cm^3$. In accordance with an embodiment of the present invention, a material of the lower epitaxial layers 160 comprises, but is not necessarily limited to, Si, Si:C, SiGe, SiGe:C, Si:B, SiGe:B, Si:P, Si:As, SiGe:P, SiGe:As, Si:CB, SiGe:CB, Si:CP, Si:CAs, SiGe:CP, and/or SiGe:CAs.

Figure 7:
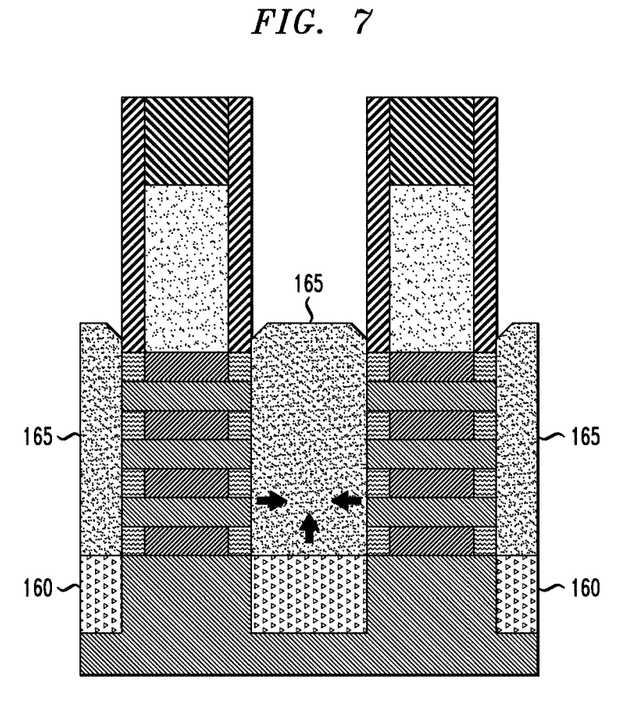
FIG. 7 is a schematic cross-sectional view illustrating manufacturing of a semiconductor device and showing epitaxial growth of source/drain regions, according to an embodiment of the invention.

FIG. 7 is a schematic cross-sectional view illustrating manufacturing of a semiconductor device and showing epitaxial growth of source/drain regions, according to an embodiment of the invention. As illustrated by the arrows in FIG. 7, epitaxial growth of source/drain regions 165 occurs from exposed sides of the silicon layers 107a-107c of the nanosheet stacks and from the lower epitaxial layers 160. According to a non-limiting embodiment of the present invention, the conditions of the epitaxial growth process for the source/drain regions 165 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure range of about 450° C. to about 800° C., and about 5 Torr-about 300 Torr.

Side portions of the SiGe layers 105a-105d are covered with remaining portions of the inner spacer layer 150 during the epitaxial growth of the source/drain regions 165, and lateral epitaxial growth does not occur from the SiGe layers 105a-105d of the patterned stacks.

The epitaxial source/drain regions 165 become the source/drain regions for transistor devices, such as, for example, NFETs or PFETs, and can comprise in-situ phosphorous doped (ISPD) Si or Si:C for n-type devices, or in-situ boron doped (ISBD) SiGe for p-type devices, at concentrations of about $1E19/cm^3$ to about $3E21/cm^3$. By "in-situ" it is meant that the dopant that dictates the conductivity type of the doped layer is introduced during the process step, e.g., epitaxial deposition, which forms the doped layer. A height of the source/drain regions 165 adjacent the nanosheet stacks extends above a top surface of the uppermost Si layer 107c.

Figure 8:
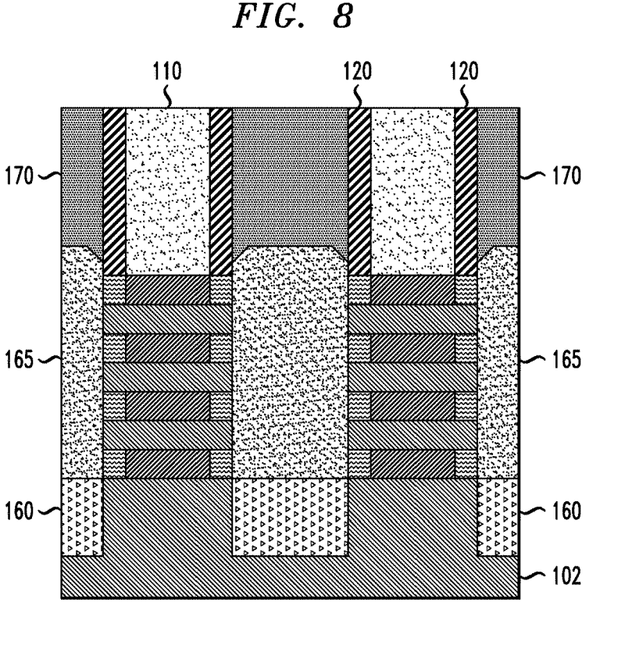
FIG. 8 is a schematic cross-sectional view illustrating manufacturing of a semiconductor device and showing a structure after inter-layer dielectric (ILD) deposition and planarization steps, according to an embodiment of the invention.

FIG. 8 is a schematic cross-sectional view illustrating manufacturing of a semiconductor device and showing a structure after inter-layer dielectric (ILD) deposition and planarization steps, according to an embodiment of the invention. Referring to FIG. 8, an ILD layer 170, including, but not necessarily limited to, silicon dioxide ($SiO_2$), low-temperature oxide (LTO), high-temperature oxide (HTO), flowable oxide (FOX) or some other dielectric is deposited on the substrate 102 to fill in areas on and around the epitaxial source/drain regions 165. The ILD layer 170 can be deposited using, for example, CVD, PECVD, RFCVD, PVD, ALD, MLD, MBD, PLD, LSMCD, and/or sputtering, followed by planarization by, for example, CMP to remove the hardmask layer 125 and upper portions of the spacers 120 adjacent the hardmask layer 125. The planarization, which removes the hardmask layer 125, exposes the top surfaces of the dummy gates 110.

Figure 9:
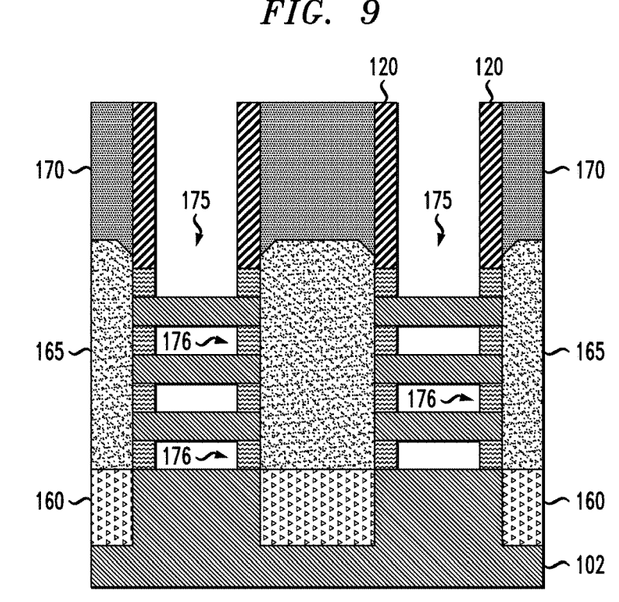
FIG. 9 is a schematic cross-sectional view illustrating manufacturing of a semiconductor device and showing dummy gate and SiGe layer removal, according to an embodiment of the invention.

FIG. 9 is a schematic cross-sectional view illustrating manufacturing of a semiconductor device and showing dummy gate and SiGe layer removal, according to an embodiment of the invention. Referring to FIG. 9, the dummy gates 110 and SiGe layers 105a-105d are selectively removed to create respective vacant areas 175 and 176 where dummy gates 110 and SiGe layers 105a-105d were removed. Then, the silicon nanosheets or nanowires 107a-107c are suspended, and the gate structure, including, for example, gate and dielectric portions are formed in place of the dummy gates 110 and SiGe layers 105a-105d. The selective removal can be performed using wet or dry chemistries selective to Si. In non-limiting examples, $CH_3COOH$:$H_2O_2$:HF or $CF_4/O_2$ based chemistries can be used. Various other etch chemistries may be used.

Figure 10:
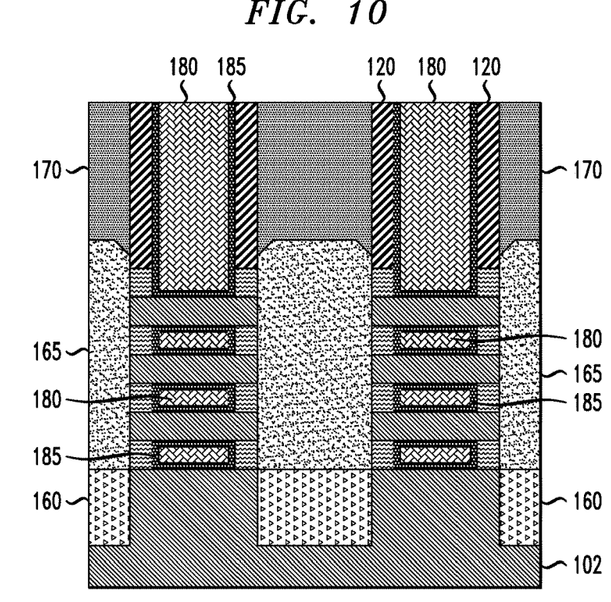
FIG. 10 is a schematic cross-sectional view illustrating manufacturing of a semiconductor device and showing gate formation steps, according to an embodiment of the invention.

FIG. 10 is a schematic cross-sectional view illustrating manufacturing of a semiconductor device and showing gate formation steps, according to an embodiment of the invention. Referring to FIG. 10, in accordance with an embodiment of the present invention, the gate structures are formed in vacant portions 175 and 176, and each include a gate dielectric layer 185 such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structures each include a gate region 180 including a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer 185. The gate region 180 can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer 185.

In one or more embodiments of the invention, the layers for the gate structures can be deposited using, for example, CVD, PECVD, RFCVD, PVD, ALD, MLD, MBD, PLD, LSMCD, and/or sputtering, followed by planarization by, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method for manufacturing a semiconductor device, comprising:
   forming a plurality of silicon germanium layers and a plurality of silicon layers on a semiconductor substrate in a stacked configuration comprising a repeating arrangement of a silicon layer stacked on a silicon germanium layer;
   patterning the stacked configuration into a plurality of patterned stacks spaced apart from each other, wherein the patterning forms a plurality of recessed portions in the semiconductor substrate;
   etching the plurality of silicon germanium layers to remove portions of the plurality of silicon germanium layers from exposed lateral sides of each of the plurality of silicon germanium layers;
   forming an inner spacer layer in place of each of the removed portions of the plurality of silicon germanium layers;
   growing a plurality of lower epitaxial layers in the plurality of recessed portions in a first epitaxial growth process, wherein the plurality of lower epitaxial layers have one or more edges aligned with outer edges of adjacent ones of the plurality of patterned stacks; and
   growing a plurality of epitaxial source/drain regions adjacent the plurality of patterned stacks, wherein the plurality of epitaxial source/drain regions are grown from the plurality of lower epitaxial layers and from exposed lateral sides of the plurality of silicon layers in a second epitaxial growth process.

2. The method according to claim 1, wherein the first epitaxial process comprises a bottom-up growth process.

3. The method according to claim 2, wherein the first epitaxial process is performed using rapid thermal chemical vapor deposition epitaxial growth using at least one of $SiH_4$, $GeH_4$, $CH_3SiH_3$, $B_2H_6$, $PF_3$, and $H_2$ gases.

4. The method according to claim 3, wherein the first epitaxial process is performed at a temperature range of about 450° C. to about 800° C., and a pressure range of about 1 Torr-about 50 Torr.

5. The method according to claim 1, wherein the plurality of lower epitaxial layers are undoped.

6. The method according to claim 1, wherein the plurality of lower epitaxial layers are carbon (C) doped.

7. The method according to claim 1, wherein the plurality of lower epitaxial layers are counter doped with respect to a doping of the plurality of epitaxial source/drain regions.

8. The method according to claim 1, wherein the plurality of lower epitaxial layers are grown to a height that is level with or substantially level with a topmost surface of the substrate under the lowermost silicon germanium layers of the plurality of patterned stacks.

9. The method according to claim 1, further comprising:
   selectively removing remaining portions of the plurality of silicon germanium layers from the plurality of patterned stacks; and
   replacing the removed remaining portions of the plurality of silicon germanium layers with respective gate structures.

10. The method according to claim 1, wherein a dummy gate is formed on each of the plurality of patterned stacks, and the method further comprises replacing the dummy gate on each of the plurality of patterned stacks with a gate structure.

11. A semiconductor device, comprising:
    a plurality of stacked structures spaced apart from each other on a substrate, wherein the plurality of stacked structures each comprise a plurality of gate structures and a plurality of channel layers;
    a plurality of lower epitaxial layers in recessed portions of the substrate adjacent the plurality of stacked structures; and
    a plurality of epitaxial source/drain regions extending from the plurality of channel layers and from the plurality of lower epitaxial layers;
    wherein the plurality of lower epitaxial layers have one or more edges aligned with outer edges of adjacent ones of the plurality of stacked structures.

12. The semiconductor device according to claim 11, wherein the plurality of lower epitaxial layers are undoped.

13. The semiconductor device according to claim 11, wherein the plurality of lower epitaxial layers are carbon (C) doped.

14. The semiconductor device according to claim 11, wherein the plurality of lower epitaxial layers are counter doped with respect to a doping of the plurality of epitaxial source/drain regions.

15. The semiconductor device according to claim 11, wherein the plurality of lower epitaxial layers are at a height that is level with or substantially level with a topmost surface of the substrate under the plurality of stacked structures.

16. A method for manufacturing a semiconductor device, comprising:

forming a plurality of first semiconductor layers and a plurality of second semiconductor layers on a semiconductor substrate in a stacked configuration comprising a repeating arrangement of a second semiconductor layer stacked on a first semiconductor layer;

patterning the stacked configuration into a plurality of patterned stacks spaced apart from each other, wherein the patterning forms a plurality of recessed portions in the semiconductor substrate;

etching the plurality of first semiconductor layers to remove portions of the plurality of first semiconductor layers from exposed lateral sides of each of the plurality of first semiconductor layers;

forming an inner spacer layer in place of each of the removed portions of the plurality of first semiconductor layers;

growing a plurality of lower epitaxial layers in the plurality of recessed portions in a first epitaxial growth process, wherein the plurality of lower epitaxial layers have one or more edges aligned with outer edges of adjacent ones of the plurality of patterned stacks; and growing a plurality of epitaxial source/drain regions adjacent the plurality of patterned stacks, wherein the plurality of epitaxial source/drain regions are grown from the plurality of lower epitaxial layers and from exposed lateral sides of the plurality of second semiconductor layers in a second epitaxial growth process.

17. The method according to claim 16, wherein the first epitaxial process comprises a bottom-up growth process.

18. The method according to claim 16, wherein the plurality of lower epitaxial layers are undoped.

19. The method according to claim 16, wherein the plurality of lower epitaxial layers are carbon (C) doped.

20. The method according to claim 16, wherein the plurality of lower epitaxial layers are counter doped with respect to a doping of the plurality of epitaxial source/drain regions.

* * * * *